United States Patent
Tzou et al.

(10) Patent No.: US 7,341,952 B2
(45) Date of Patent: Mar. 11, 2008

(54) MULTI-LAYER HARD MASK STRUCTURE FOR ETCHING DEEP TRENCH IN SUBSTRATE

(75) Inventors: Kaan-Lu Tzou, Taipei (TW); Tzu-Ching Tsai, Taoyuan (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 248 days.

(21) Appl. No.: 11/348,626

(22) Filed: Feb. 7, 2006

(65) Prior Publication Data

US 2006/0127680 A1    Jun. 15, 2006

Related U.S. Application Data

(62) Division of application No. 10/727,790, filed on Dec. 4, 2003, now Pat. No. 7,029,753.

(30) Foreign Application Priority Data

Aug. 19, 2003  (TW) .............................. 92122720 A

(51) Int. Cl.
*H01L 21/302*    (2006.01)

(52) U.S. Cl. ...................... 438/706; 438/718; 438/719; 438/723; 438/736; 438/743; 216/79; 216/80

(58) Field of Classification Search ................ 438/706, 438/718, 719, 723, 743; 216/79, 80
See application file for complete search history.

(56) References Cited

U.S. PATENT DOCUMENTS

| | | | | |
|---|---|---|---|---|
| 6,124,206 A | * | 9/2000 | Flietner et al. | 438/692 |
| 6,214,686 B1 | * | 4/2001 | Divakaruni et al. | 438/386 |
| 6,969,686 B2 | * | 11/2005 | Hsieh et al. | 438/723 |
| 2002/0173163 A1 | * | 11/2002 | Gutsche | 438/736 |
| 2004/0067654 A1 | * | 4/2004 | Chen et al. | 438/706 |
| 2004/0092115 A1 | * | 5/2004 | Hsieh et al. | 438/694 |
| 2004/0262669 A1 | * | 12/2004 | Shum et al. | 257/315 |

* cited by examiner

*Primary Examiner*—Binh X. Tran
(74) *Attorney, Agent, or Firm*—Quintero Law Office

(57) ABSTRACT

A method for etching a deep trench in a substrate. A multi-layer hard mask structure is formed overlying the substrate, which includes a first hard mask layer and at least one second hard mask layer disposed thereon. The first hard mask layer is composed of a first boro-silicate glass (BSG) layer and an overlying first undoped silicon glass (USG) layer and the second is composed of a second BSG layer and an overlying second USG layer. A polysilicon layer is formed overlying the multi-layer hard mask structure and then etched to form an opening therein. The multi-layer hard mask structure and the underlying substrate under the opening are successively etched to simultaneously form the deep trench in the substrate and remove the polysilicon layer. The multi-layer hard mask structure is removed.

14 Claims, 6 Drawing Sheets

MULTI-LAYER HARD MASK STRUCTURE FOR ETCHING DEEP TRENCH IN SUBSTRATE

This application is a divisional of U.S. application Ser. No. 10/727,790, filed Dec. 4, 2003 now U.S. Pat No. 7,029,753.

BACKGROUND OF THE INVENTION

1. Field of the Invention

The present invention relates in general to a hard mask structure for etching a deep trench etch in a substrate, and more particularly, to a boro-silicate glass (BSG) containing multi-layer hard mask structure for etching a deep trench in a substrate.

2. Description of the Related Art

Dynamic random access memory (DRAM) is an important semiconductor device in the information and electronics industry. Most DRAMs presently have one access transistor and one storage capacitor in one DRAM cell. With increased integration, however, 3-D capacitors, such as deep trench capacitors, have become necessary. Typically, 3-D capacitors are disposed in a deep trench formed by etching a silicon substrate. Thereafter, an access transistor is formed overlying the deep trench capacitor to complete a deep trench DRAM cell.

In the formation of integrated circuits, it is often necessary to etch a silicon substrate to form a trench therein. In particular, the trend towards packing more memory cells into a given chip area has led to the development of trench DRAM cells which require deep and narrow apertures in the silicon substrate.

FIGS. 1a to 1c are cross-sections showing a conventional method for etching a deep trench in a silicon substrate. First, in FIG. 1a, a silicon substrate 100 is provided. A pad dielectric layer comprising a thin silicon oxide layer 102 and an overlying silicon nitride layer 104 is formed in the silicon substrate 100. Next, a hard mask layer 106, such as a BSG layer, is formed overlying the pad dielectric layer 102 and 104 for etching the subsequent deep trench. Thereafter, an optional annealing process is performed on the hard mask layer 106. A photoresist pattern layer 108 is formed on the hard mask layer 106 and has an opening 110 to expose the region for etching deep trench.

Next, in FIG. 1b, the hard mask layer 106 and the underlying pad dielectric layer 102 and 104 under the opening 110 are successively etched to form an opening 112 therein, thus exposing the surface of the silicon substrate 100. Next, the photoresist pattern layer 108 is removed.

Finally, in FIG. 1C, the exposed surface of the substrate 100 is etched using the hard mask layer 106 as an etching mask to form a deep trench 114 in the substrate 100. Meanwhile, a portion of the hard mask layer 106 is consumed by etching.

After the deep trench 114 is formed, the hard mask layer 106 is necessary to be removed. The hard mask layer 106 can be removed by vapor hydrofluoric acid (VHF), HF solution, or a buffer oxide etching (BOE) solution. However, after the hard mask layer 106 composed of BSG is annealed, the boron atoms diffuse upwardly. As a result, poor boron atom concentration uniformity is obtained and a practically undoped region (not shown) is formed near the bottom of the hard mask layer 106. Since such an undoped region is difficult to remove by VHF, a remaining hard mask layer 106a is formed on the pad dielectric layer 102 and 104, as shown in FIG. 2a. Additionally, if the hard mask layer 106 is removed by HF solution or BOE solution, there is no remaining hard mask layer. However, the underlying thin silicon oxide layer 102 is undercut, as shown by the arrows in FIG. 2b. As a result, the overlying silicon nitride layer 104 is subject to peeling, thus reducing device yield.

Although no hard mask layer remains without previous annealing of the hard mask layer, various depths and critical dimensions (CDs) result from subsequent deep trench formation in the substrate.

SUMMARY OF THE INVENTION

Accordingly, an object of the present invention is to provide a novel method for etching a deep trench in a substrate, which employs a multi-layer hard mask structure for deep trench etching, instead of the conventional single boro-silicate glass (BSG) layer as the hard mask, and the multi-layer hard mask structure is then annealed, thereby improving boron atom concentration uniformity in the hard mask and preventing deep trenches from having various depths and critical dimensions (CDs).

Another object of the present invention is to provide a novel multi-layer hard mask structure, which has an undoped silicate glass (USG) layer disposed between each BSG layer to serve as a diffusion barrier layer, thereby prevent upward diffusion of boron atoms in the hard mask thermal processes, preventing formation of residue subsequent to removal of the hard mask.

Yet another object of the present invention is to provide a novel method for etching a deep trench in a substrate, which uses a multi-layer hard mask structure and a BSG layer with higher doping concentration is formed in the bottom of the multi-layer hard mask structure, thereby maintaining boron atom concentration uniformity in the multi-layer hard mask structure.

According to the object of the invention, a multi-layer hard mask structure is provided, which includes a first hard mask layer and at least one second hard mask layer. The first hard mask layer is composed of a first boro-silicate glass layer and an overlying first undoped silicon glass layer. The second hard mask layer is disposed on the first hard mask layer, which is composed of a second boro-silicate glass and an overlying second undoped silicon glass layer.

Moreover, the doping concentration of the first boro-silicate glass layer is about $4\times10^{17}$ to $8\times10^{17}$ atom/cm$^2$ and substantially equal to that of the second boro-silicate glass layer.

In addition, the doping concentration of the first boro-silicate glass layer can be higher than that of the second boro-silicate glass layer, wherein the doping concentration of the first boro-silicate glass layer is about $4\times10^{17}$ to $8\times10^{17}$ atom/cm$^2$ and that of the second boro-silicate glass layer is about $1\times10^{17}$ to $5\times10^{7}$ atom/cm$^2$.

Moreover, the first boro-silicate glass layer has a thickness of about 0.3 μm. The first undoped silicon glass layer has a thickness of about 100 to 400 Å and the second undoped silicon glass layer has a thickness of about 100 to 400 Å.

Still according to the object of the invention, a method for etching a deep trench in a substrate is provided. A multi-layer hard mask structure is formed overlying the substrate, which includes a first hard mask layer and at least one second hard mask layer disposed thereon. The first hard mask layer is composed of a first boro-silicate glass layer and an overlying first undoped silicon glass layer and the second hard mask layer is composed of a second boro-silicate glass layer and an overlying second undoped silicon glass layer. Next, a polysilicon layer is formed overlying the multi-layer hard mask structure and then etched to form an opening therein and expose a portion of the multi-layer hard mask structure. Next, the multi-layer hard mask structure and the underlying substrate under the opening are successively etched to simultaneously form the deep trench in the substrate and remove the polysilicon layer. Finally, the multi-layer hard mask structure is removed. Moreover, the multi-layer hard mask structure can be annealed at 550 to 600° C. for 15 to 25 min before the polysilicon layer is formed thereon.

Moreover, the doping concentration of the first boro-silicate glass layer is about $4 \times 10^{17}$ to $8 \times 10^{17}$ atom/cm$^2$ and substantially equal to that of the second boro-silicate glass layer.

In addition, the doping concentration of the first boro-silicate glass layer can be higher than that of the second boro-silicate glass layer, wherein the doping concentration of the first boro-silicate glass layer is about $4 \times 10^{17}$ to $8 \times 10^{17}$ atom/cm$^2$ and that of the second boro-silicate glass layer is about $1 \times 10^{17}$ to $5 \times 10^{17}$ atom/cm$^2$.

Moreover, the first boro-silicate glass layer has a thickness of about 0.3 μm. The first undoped silicon glass layer has a thickness of about 100 to 400 Å and the second undoped silicon glass layer has a thickness of about 100 to 400 Å. The polysilicon layer has a thickness of about 0.2 to 0.3 μm.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 3a to 3d are cross-sections showing a method for etching a deep trench in a substrate according to the invention.

Figure 1A:
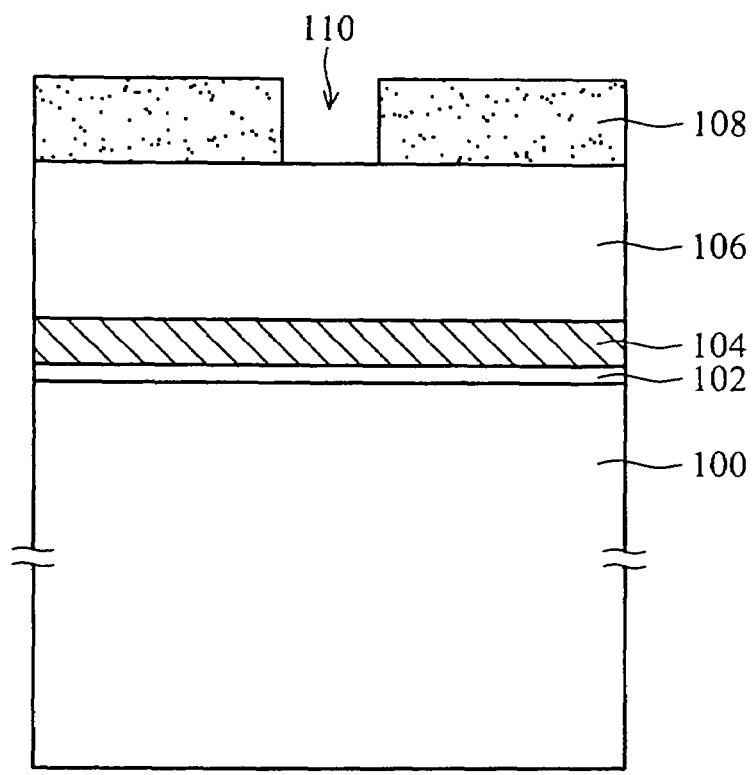
FIGS. 1a to 1c are cross-sections showing a conventional method for etching a deep trench in a silicon substrate.
Figure 1B:
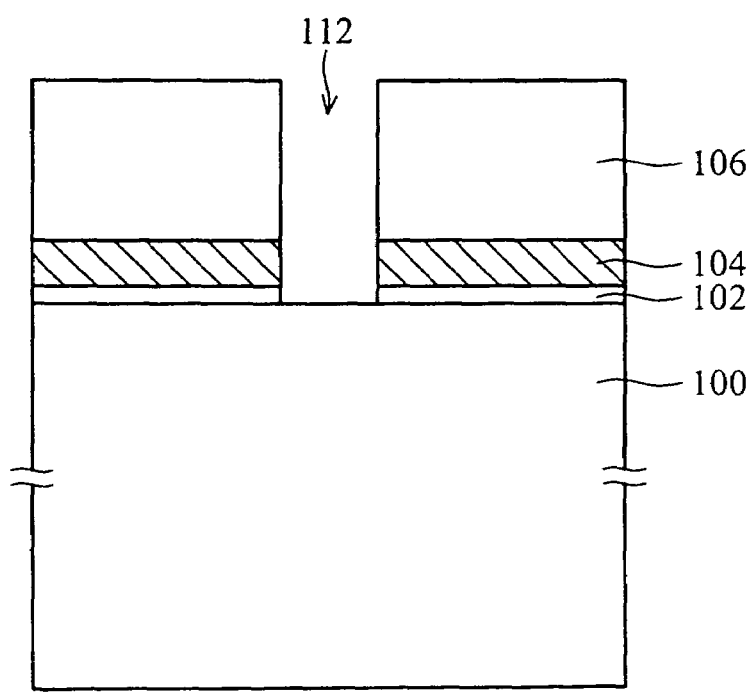
Figure 1C:
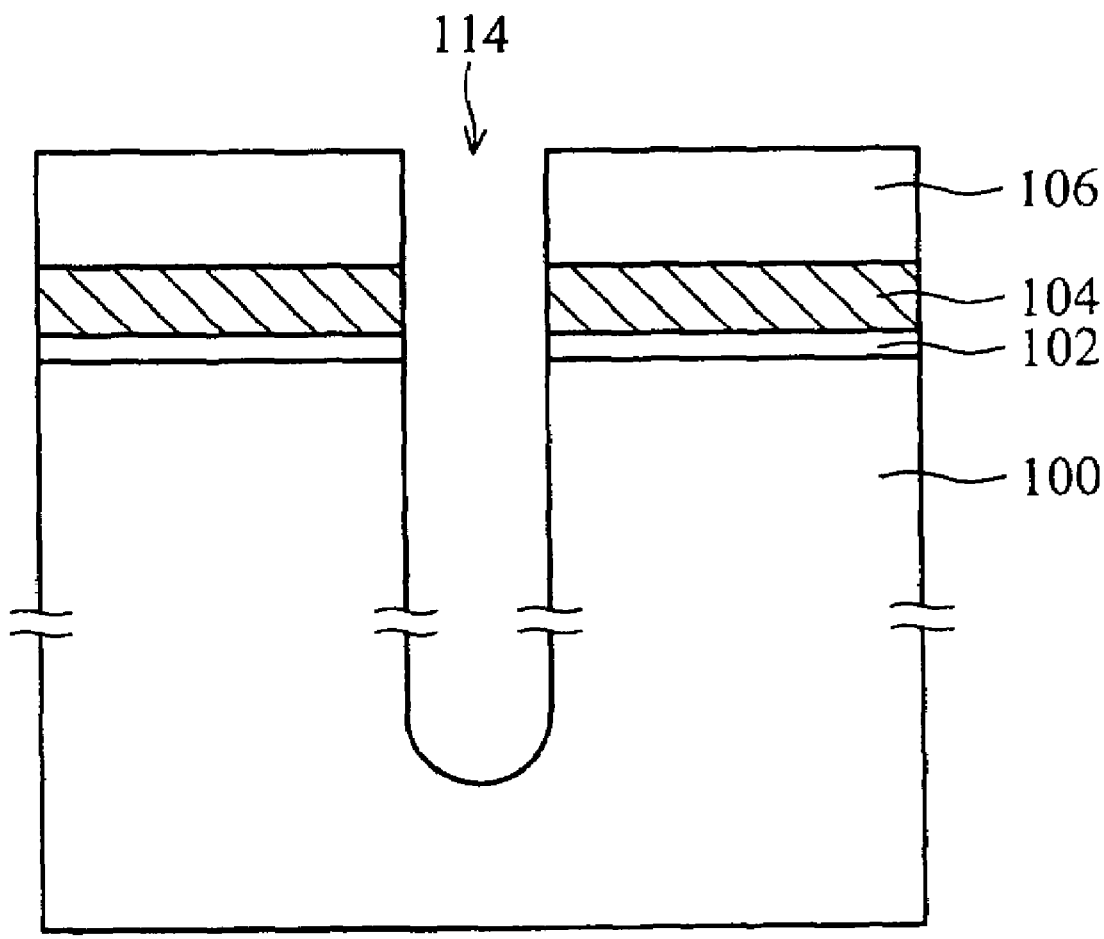
Figure 2A:
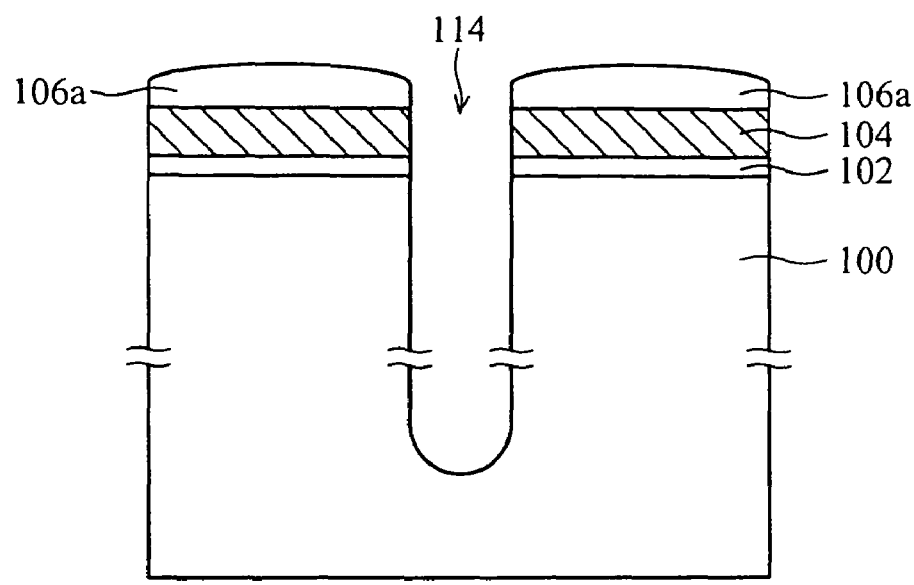
FIG. 2a is a cross-section showing a remaining hard mask layer formed over a deep trench with residue thereon of the prior art.
Figure 2B:
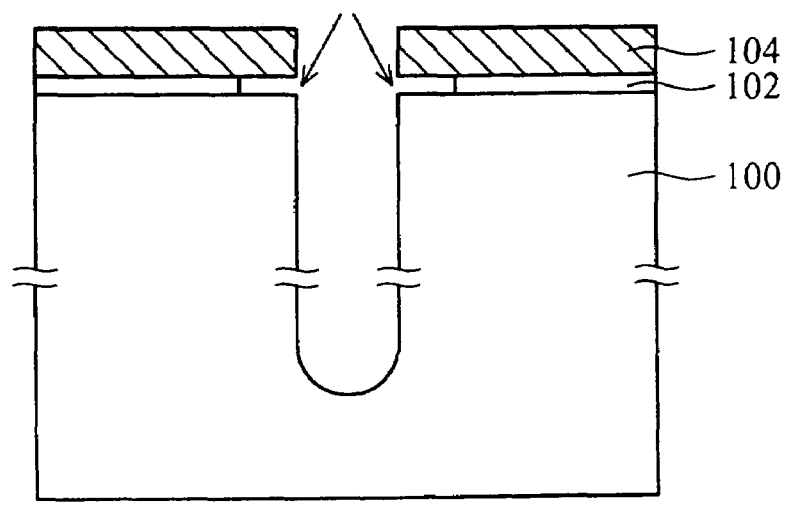
FIG. 2b is a cross-section showing an undercut pad dielectric layer formed over a deep trench of the prior art.
Figure 3A:
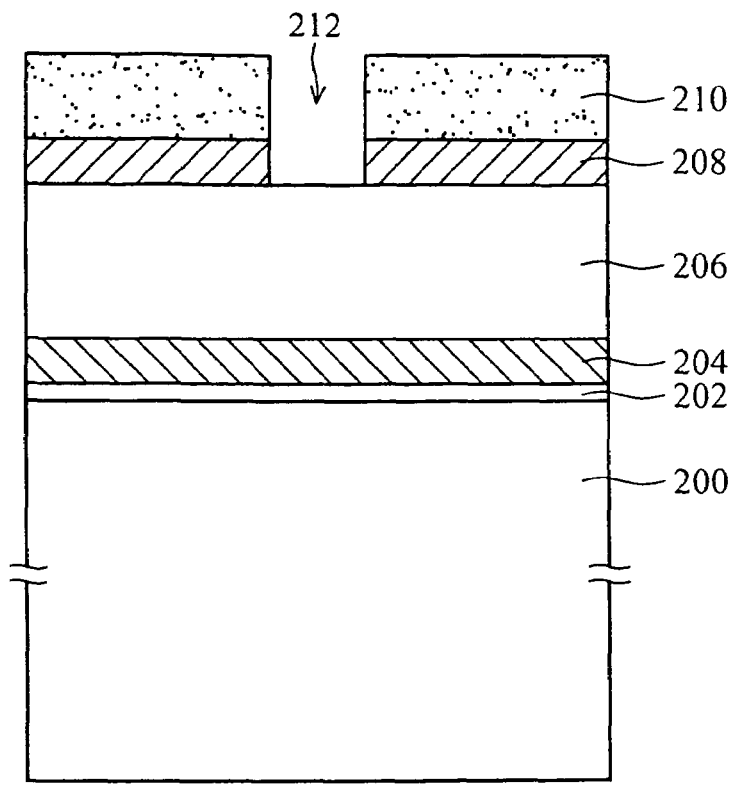
FIGS. 3a to 3d are cross-sections showing a method for etching a deep trench in a substrate according to the invention.

First, in FIG. 3a, a substrate 200, such as a silicon substrate, is provided. A pad dielectric layer is formed on the substrate 200, which can be composed of a pad oxide layer 202 and a thicker silicon nitride layer 204. In this invention, the pad oxide layer 202 can be formed by thermal oxidation. The silicon nitride layer 204 overlying the pad oxide layer 202 can be formed by low-pressure CVD (LPCVD).

Next, a multi-layer hard mask structure 206 is formed overlying the pad dielectric layer 202 and 204. In order to simplify the diagram, only a flat substrate is shown.

Figure 4:
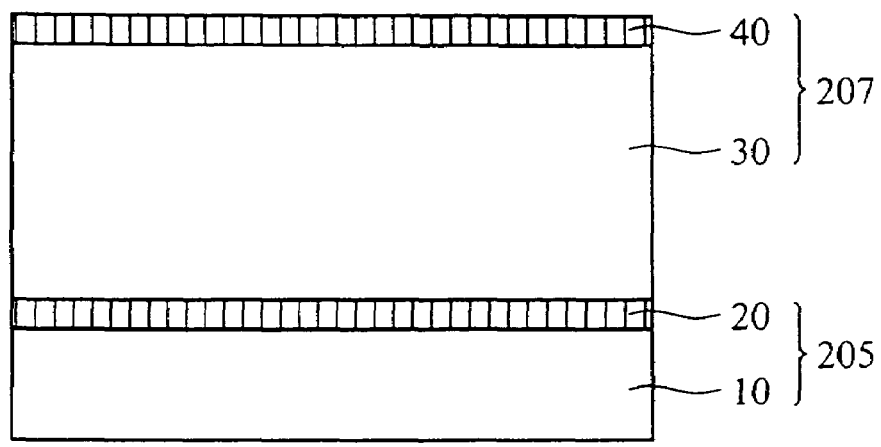
FIG. 4 is a cross-section showing a multi-layer hard mask structure according to one embodiment of the invention.

Next, in FIG. 4, a cross-section of the multi-layer hard mask structure 206 according to an embodiment of the invention is shown. The multi-layer hard mask structure 206 includes a first hard mask layer 205 and a second hard mask layer 207 disposed thereon. In the invention, the first hard mask layer 205 is composed of a boro-silicate glass (BSG) layer 10 and an overlying undoped silicon glass (USG) layer 20. The boro-silicate glass layer 10 has a thickness of about 0.3 μm and the undoped silicon glass layer 20 has a thickness of about 100 to 400 Å. The undoped silicon glass layer 20 is used as a diffusion barrier layer. Accordingly, the boron atoms in the boro-silicate glass layer 10 are diffused in the overlying undoped silicon glass layer 20 during heat treatment and prevent upward diffusion.

The second hard mask layer 207 is also composed of a boro-silicate glass layer 30 and an overlying undoped silicon glass layer 40. The boro-silicate glass layer 30 has a thickness of about 1.2 to 1.4 μm and the undoped silicon glass layer 40 has a thickness of about 100 to 400 Å. Here, the doping concentration of the boro-silicate glass layer 10 is about $4 \times 10^{17}$ to $8 \times 10^{17}$ atom/cm$^2$ and substantially equal to that of the second boro-silicate glass layer 30. In the invention, the undoped silicon glass layers 20 and 40 are used as diffusion barrier layers for the double hard mask layers 205 and 207, respectively, to prevent a practically undoped region from forming near the bottom of the hard mask structure 206 due to the poor doping concentration uniformity after heat treatment is performed. In addition, in order to further prevent such a practically undoped region forming near the bottom of the hard mask structure 206, the doping concentration of the boro-silicate glass layer 10 can be higher than that of the second boro-silicate glass layer 30. Here, the doping concentration of the boro-silicate glass layer 10 is about $4 \times 10^{17}$ to $8 \times 10^{17}$ atom/cm$^2$ and that of the second boro-silicate glass layer 30 is about $1 \times 10^{17}$ to $5 \times 10^{17}$ atom/cm$^2$.

Figure 5:
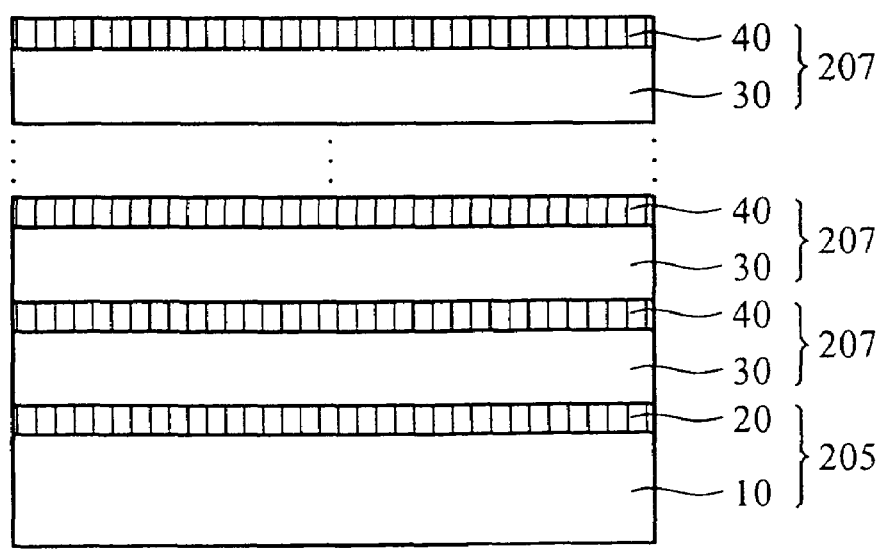
FIG. 5 is a cross-section showing a multi-layer hard mask structure according to another embodiment of the invention.

Next, in FIG. 5, a cross-section of the multi-layer hard mask structure 206 according to another embodiment of the invention is shown. The multi-layer hard mask structure 206 includes a first hard mask layer 205 and a plurality of second hard mask layers 207 disposed thereon. In the multi-layer hard mask structure 206, the first hard mask layer 205 is composed of a boro-silicate glass layer 10 and an overlying undoped silicon glass layer 20. The boro-silicate glass layer 10 has a thickness of about 0.3 μm and the undoped silicon glass layer 20 has a thickness of about 100 to 400 Å.

The second hard mask layer 207 is also composed of a plurality of boro-silicate glass layers 30 and overlying undoped silicon glass layers 40. Here, different to FIG. 4, all of the boro-silicate glass layers 30 and the undoped silicon glass layers 40 have a total thickness of about 1.2 to 1.4 μm and each undoped silicon glass layer 40 has a thickness of about 100 to 400 Å. Moreover, the doping concentration of the boro-silicate glass layer 10 is about $4 \times 10^{17}$ to $8 \times 10^{17}$ atom/cm$^2$ and substantially equal to that of each second boro-silicate glass layer 30. In the invention, the undoped silicon glass layers 20 and 40 are used as diffusion barrier layers for double hard mask layers 205 and 207, respectively, to prevent a formation of a practically undoped region near the bottom of the hard mask structure 206 due to the poor doping concentration uniformity after heat treatment is performed. Moreover, the doping concentration uniformity of the entire hard mask structure 206 can be further increased after the second boro-silicate glass layers 30 are annealed. Also, in order to further prevent formation of such a practically undoped region near the bottom of the hard mask structure 206, the doping concentration of the boro-silicate glass layer 10 can be higher than that of the second boro-silicate glass layer 30. Here, the doping concentration of the boro-silicate glass layer 10 is about $4 \times 10^{17}$ to $8 \times 10^{17}$ atom/cm$^2$ and that of each second boro-silicate glass layer 30 has a doping concentration of about $1 \times 10^{17}$ to $5 \times 10^{17}$ atom/cm$^2$.

As mentioned above, in order to prevent deep trenches have various depths and critical dimensions, the hard mask structure 206 containing boro-silicate glass is necessary to be annealed. In the invention, the annealing is performed at 550 to 600° C. for 15 to 25 min.

Thereafter, a polysilicon layer 208 is formed overlying the multi-layer hard mask structure 206 by conventional deposition, such as CVD, at a deposition temperature of about 550 to 620° C. The polysilicon layer 208 has a thickness of about 0.2 to 0.3 μm and serves as a hard mask to define the multi-layer hard mask structure 206.

Next, a photoresist pattern layer 210 is formed overlying the polysilicon layer 208 by lithography, which has at least one opening to expose the region for deep trench etching. Thereafter, the polysilicon layer 208 under the opening is etched by, for example, reactive ion etching (RIE), to form an opening 212 therein and expose a portion of the multi-layer hard mask structure 206.

Figure 3B:
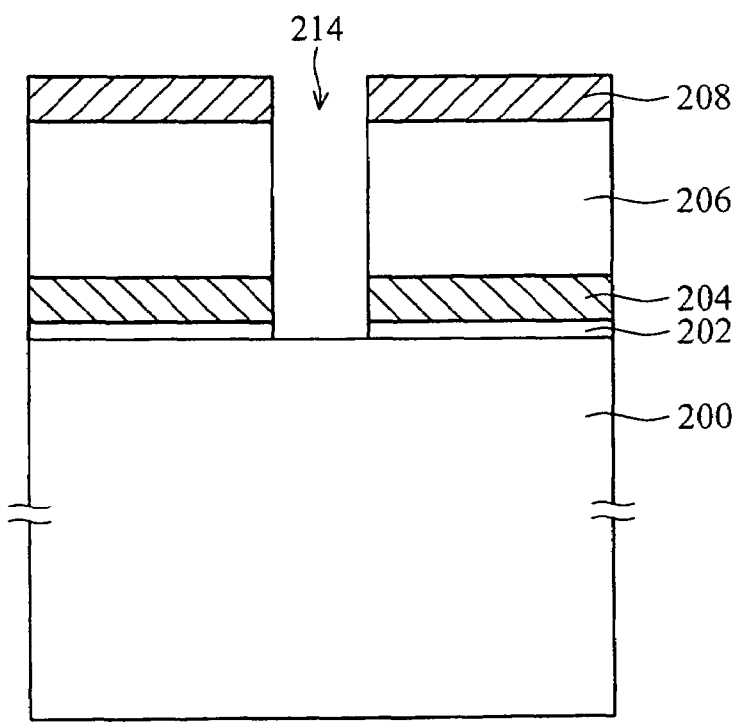

Next, in FIG. 3b, after the photoresist pattern layer 210 is removed by ashing or suitable solution, the multi-layer hard mask structure 206 and the underlying pad dielectric layer 202 and 204 are successively etched using the polysilicon layer 208 as an etch mask to form an opening 214 therein and expose a portion of surface of the substrate 200.

Figure 3C:
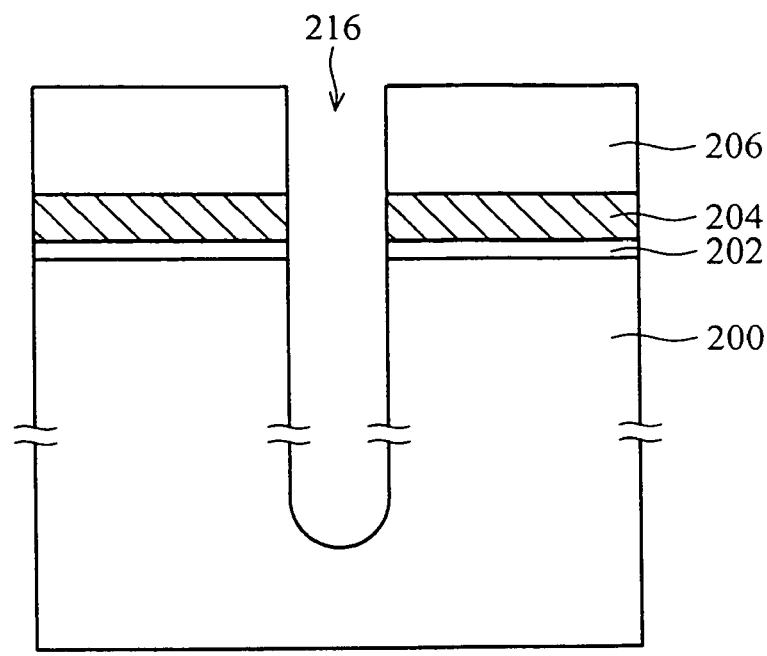

Next, in FIG. 3c, the exposed substrate 200 is etched by, for example, RIE, to simultaneously form a deep trench 216 therein and remove the polysilicon layer 208. Meanwhile, a portion of the multi-layer hard mask structure 206 is consumed due to etching.

Figure 3D:
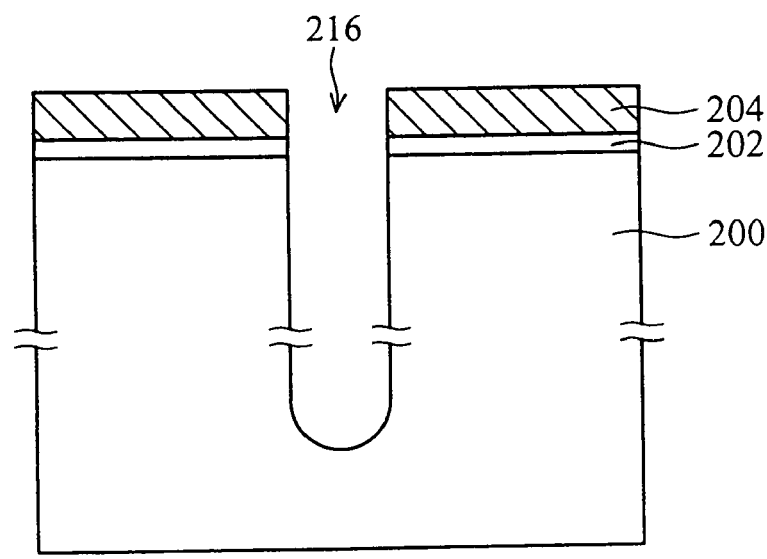

Finally, the multi-layer hard mask structure 206 is removed by VHF to expose the surface of the pad dielectric layer 202 and 204. As previously mentioned, since there is no practically undoped region formed near the bottom of the multi-layer hard mask structure 206, the multi-layer hard mask structure 206 can be completely removed, as shown in FIG. 3d. Moreover, in the invention, since the multi-layer hard mask structure 206 is removed by VHF, no undercutting occurs on the thin silicon oxide layer 202.

Compared with the conventional method for etching a deep trench in a substrate using a single boro-silicate glass layer as a hard mask, the multi-layer hard mask structure of the invention can improve the boron atom concentration uniformity and prevent the deep trenches from having various depths and critical dimensions after annealing is performed on the multi-layer hard mask structure. Moreover, in the multi-layer hard mask structure of the invention, an undoped silicon layer is disposed between each boro-silicate glass layer to serve as a diffusion barrier layer, thereby preventing continuous upward diffusion of boron atoms. Accordingly, the hard mask structure can be removed completely, thereby increasing device yield. Moreover, in the invention, a boro-silicate glass layer having higher doping concentration can be disposed in the bottom of the multi-layer hard mask structure, thereby further maintaining boron atom concentration uniformity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for etching a deep trench in a substrate, comprising the steps of:
    forming a multi-layer hard mask structure overlying the substrate, comprising a first hard mask layer and at least one second hard mask layer disposed thereon, wherein the first hard mask layer is composed of a first boro-silicate glass layer and an overlying first undoped silicon glass layer and the second hard mask layer is composed of a second boro-silicate glass layer and an overlying second undoped silicon glass layer;
    forming a polysilicon layer overlying the multi-layer hard mask structure;
    etching the polysilicon layer to form an opening therein and expose a portion of the multi-layer hard mask structure;
    successively etching the multi-layer hard mask structure and the underlying substrate under the opening to simultaneously form the deep trench in the substrate and remove the polysilicon layer; and
    removing the multi-layer hard mask structure.

2. The method as claimed in claim 1, further forming a pad oxide layer and an overlying silicon nitride layer between the substrate and the multi-layer hard mask structure.

3. The method as claimed in claim 1, wherein the first boro-silicate glass layer has a thickness of about 0.3 μm.

4. The method as claimed in claim 1, wherein the first undoped silicon glass layer has a thickness of about 100 to 400Å.

5. The method as claimed in claim 1, wherein the second undoped silicon glass layer has a thickness of about 100 to 400Å.

6. The method as claimed in claim 1, wherein the polysilicon layer has a thickness of about 0.2 to 0.3 μm.

7. The method as claimed in claim 1, further annealing the multi-layer hard mask structure before the polysilicon layer is formed.

8. The method as claimed in claim 7, wherein the annealing is performed at 550 to 600° C.

9. The method as claimed in claim 7, wherein the annealing is performed for 15 to 25 minutes.

10. The method as claimed in claim 1, wherein a doping concentration of the first boro-silicate glass layer is substantially equal to that of the second boro-silicate glass layer.

11. The method as claimed in claim 10, wherein the doping concentration of the first boro-silicate glass layer is about $4 \times 10^{17}$ to $8 \times 10^{17}$ atom/cm$^2$.

12. The method as claimed in claim 1, wherein a doping concentration of the first boro-silicate glass layer is higher than that of the second boro-silicate glass layer.

13. The method as claimed in claim 12, wherein the doping concentration of the first boro-silicate glass layer is about $4 \times 10^{17}$ to $8 \times 10^{17}$ atom/cm$^2$.

14. The method as claimed in claim 12, wherein the doping concentration of the second boro-silicate glass layer is about $1 \times 10^{17}$ to $5 \times 10^{17}$ atom/cm$^2$.

* * * * *